(12) United States Patent
Barcella et al.

(10) Patent No.: US 6,363,015 B1
(45) Date of Patent: Mar. 26, 2002

(54) READING METHOD FOR NON-VOLATILE MEMORIES WITH SENSING RATIO VARIABLE WITH THE READING VOLTAGE, AND DEVICE TO REALIZE SAID METHOD

(75) Inventors: Antonio Barcella, Trescore Balneario; Paolo Rolandi, Voghera, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/589,723

(22) Filed: Jun. 8, 2000

(30) Foreign Application Priority Data

Jun. 21, 1999 (EP) .............................................. 99830382

(51) Int. Cl.⁷ .............................................. G11C 16/06
(52) U.S. Cl. .............................. 365/185.21; 365/185.2; 365/189.09; 365/207
(58) Field of Search .......................... 365/189.2, 189.21, 365/210, 207, 208, 189.07, 189.09, 226; 327/51, 52, 53

(56) References Cited

U.S. PATENT DOCUMENTS

| | | | |
|---|---|---|---|
| 4,713,797 A | | 12/1987 | Morton et al. .............. 365/208 |
| 5,040,148 A | * | 8/1991 | Nakai et al. ............ 365/189.01 |
| 5,381,374 A | * | 1/1995 | Shiraishi et al. ............. 365/203 |
| 5,487,045 A | | 1/1996 | Trodden ...................... 365/205 |
| 5,528,543 A | * | 6/1996 | Stiegler ....................... 365/207 |
| 5,559,737 A | * | 9/1996 | Tanaka et al. .......... 365/185.25 |
| 5,627,790 A | * | 5/1997 | Golla et al. .................. 365/210 |
| 5,864,513 A | * | 1/1999 | Pascucci ...................... 365/210 |
| 5,917,753 A | * | 6/1999 | Dallabora et al. ..... 365/185.21 |
| 6,038,173 A | * | 3/2000 | Yero ...................... 365/185.25 |
| 6,055,187 A | * | 4/2000 | Dallabora et al. ..... 365/185.21 |

FOREIGN PATENT DOCUMENTS

| | | | |
|---|---|---|---|
| EP | A-0 486 743 | 5/1992 | .......... G11C/16/06 |
| EP | A-0 487 808 | 6/1992 | .......... G11C/16/06 |
| EP | A-0 805 454 | 11/1997 | .......... G11C/7/00 |
| EP | A-0 814 483 | 12/1997 | .......... G11C/16/06 |

OTHER PUBLICATIONS

European Search Report from European Patent Application 99830382.0, filed Jun. 21, 1999.

* cited by examiner

Primary Examiner—David Nelms
Assistant Examiner—Gene N. Auduong
(74) Attorney, Agent, or Firm—Wolf, Greenfield & Sacks, P.C.; James H. Morris

(57) ABSTRACT

A reading method for non-volatile memory cells is which includes a first step in which a memory cell of the matrix is selected by the row decoder and by the column multiplexer, a second step of preload and equalization during which the voltage on the drain electrode of the selected memory cell reaches a defined value and a third step during which the selected cell is read with a sensing ratio depending on the reading voltage of said cell. Moreover a device for the reading of the cells is described, which comprises a modulation branch with at least one modulation transistor and a load generator associated with said modulation transistor in such a way to modulate analogous the transconductance of one of the two load transistors as a function of the reading voltage of the memory cell.

9 Claims, 8 Drawing Sheets

READING METHOD FOR NON-VOLATILE MEMORIES WITH SENSING RATIO VARIABLE WITH THE READING VOLTAGE, AND DEVICE TO REALIZE SAID METHOD

BACKGROUND OF THE INVENTION

1. Field of the Invention

The present invention relates to a reading method for non-volatile memory cells with a sensing ratio depending on the reading voltage and to a device to realize said method.

2. Discussion of the Related Art

Semiconductor memories are universally organized as arrays having cells of the capacitance of a single bit. These arrays are surrounded by an address decoding logic and by circuitry for interfacing with outside signals.

As known, the largest part of the memories works in a way that the row address enables all the cells along the selected line. The contents of these cells become available along the selected column line.

Additional circuitry, including sense amplifiers, control logic and input-output tri-state buffer is usually required to realize the functionality of the memory.

In memory devices like ROM (read only memory), EPROM (erasable programmable ROM), EEPROM (electrically erasable programmable ROM), etc. the reading of said memory cells occurs through the comparison of the current of the matrix cell (Ic) with a k fraction (with 0<k<1) of the current of a reference cell (Ir), that is technologically identical to the matrix cell. In said types of devices single ended sense amplifiers are usually used to perform reading and programming operation. The value of the current in the programmed memory cell must be lower than a k fraction of the value of the current of the reference memory cell, that is Icp<k*Ir. The value of the current in a virgin memory cell must be higher than a fraction of the current of the memory reference cell, that is Icv>k*Ir.

For the programmed cells a high sensing ratio k would be preferable to make necessary a lower jump of the threshold level in function of the maximum reading voltage, so as to allow a higher maximum reading voltage. For the virgin cells a low sensing ratio would be preferable because, when the reading operation happens with values of voltage near the values of the threshold voltage of the cell, a low k facilitates this kind of operation. The k ratio is called the sensing ratio and is determined by technological considerations, as the level of the threshold voltage of the virgin cell and the possible threshold jump after a programming operation, and by device features, like the supply voltage. Such choice constitutes a compromise between two contrasting demands.

Usually, in a typical sense amplifier with fixed current unbalance, a cell of the matrix memory is selected by the row decoder and by the column multiplexer and after a first preload and equalization operation of the two branches, one of which assigned to the transport of the current of the memory cell and the other to the transport of the current in the reference cell, the voltages that develop at the positive and negative terminal of the operational amplifier depend on the currents of the said two cells and on the transconductances of the transistors acting as loads. Therefore the sensing ratio k is in function of the transconductance ratio of the two load transistors and it results to be constant.

In view of the described state of the art, object of the present invention is to realize a system for reading the memory cells with a sensing ratio depending on the reading voltage.

SUMMARY OF THE INVENTION

In accordance with the present invention, this and other objects are achieved by a reading method for non-volatile memory cells comprising a first step in which a memory cell of the matrix is selected by the row decoder and the column multiplexer, a second step of preload and equalization during which the voltage on the drain electrode of the selected memory cell reaches a predefined value, and a third step during which the selected cell with a sensing ratio depending on the reading voltage of said cell is read.

According to another embodiment of the invention, a device is provided comprising at least a reference branch with at least one load transistor and a reading branch for reading the programmed memory cell and including at least one load transistor, including at least one modulation branch with at least one selection transistor and a load generator associated with said modulation transistor to modulate in an analogous way the transconductance of one of the two load transistors as a function of the reading voltage of the memory cell.

Thanks to the present invention it is possible to realize a reading system for the memory cells which has a sensing ratio k that varies as a function of the reading voltage of the memory cell.

BRIEF DESCRIPTION OF THE DRAWINGS

The features and the advantages of the present invention will be evident form the following detailed description of an embodiment thereof, illustrated as a non limiting example in the enclosed drawings, in which.

DETAILED DESCRIPTION

Figure 1:
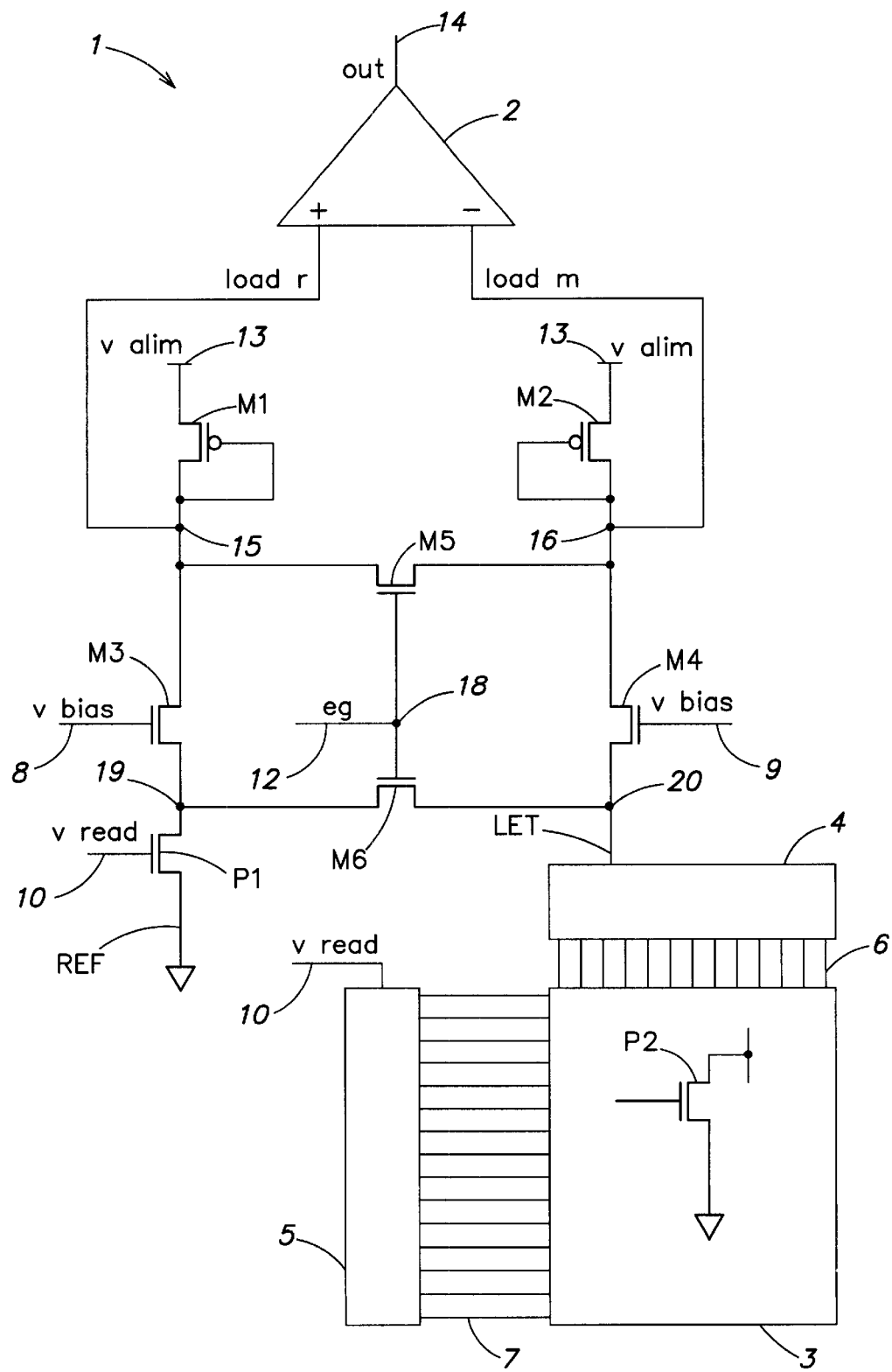
FIG. 1 illustrates a sense amplifier according to the prior art with load transistors in transdiode configuration.

In FIG. 1, there is indicated with 1, a simplified schematic diagram of a sense amplifier according to the prior art, including a reference branch "REF" and a reading branch "LET".

As shown in such a figure there is a differential amplifier 2; two p-type transistors, M1 and M2; a plurality of n-type transistors, M3, M4, M5 and M6; a reference cell P1; a memory matrix 3; a column multiplexer 4; a row decoder 5; a memory cell P2 in the matrix 3; a plurality of vertical connection lines 6, outgoing from the matrix 3 and entering in the column multiplexer 4, a plurality of horizontal connection lines 7, outgoing from the row decoder 5 and entering in the matrix 3; biasing lines 8, called "vbias"; reading lines 10, called "vread"; an equalization line 12, called "eq"; a supply line 13, called "valim"; an output line 14 of the operational amplifier 2, called "out".

The operational amplifier 2 has the positive terminal, called "loadr", linked at the node 15 with the drain electrode of the transistor M1, with an electrode of the transistor M5 and with an electrode of the transistor M3, while the negative terminal, called "loadm", is linked at the node 16 with the drain electrode of the transistor M2 with the other electrode of the transistor M5 and with an electrode of the transistor M4.

The load transistor M1 has the gate electrode short circuited with the drain electrode in a way to realize the transdiode configuration, the source electrode of the transistor M1 is linked with the supply line 13 as well as the transistor M2, also in a transdiode configuration.

The equalization transistor M5 has the gate electrode 18 in common with the transistor M6 and with the line 12.

The equalization transistor M6 has an electrode 19 in common with an electrode of the transistor M3 and with the drain electrode of the transistor P1, while the other electrode 20 is linked to the output line of the column multiplexer 4.

The transistor M3 has the gate electrode linked to the line 8 and the transistor M4 has the gate electrode linked to the line 8.

The reference cell P1 has the gate electrode linked to the line 10, while the source electrode is at ground.

The load transistors M1 and M2 are both linked in a transdiode configuration and therefore the resistance that offer at the nodes 15 and 16 is equal to the opposite of their transconductances, that is 1/g1 for the transistor M1, and 1/g2 for the transistor M2.

The memory cell P2 of the matrix 3 is selected by the row decoder 5 by the activation of a line of the plurality of lines 7 and by the column multiplexer 4 by activation of a line of the plurality of lines 6. After a first equalization operation in which the line 12 is at a high voltage and the voltage on the drain electrode of the memory cell P2 reaches the desider threshold value, the sensing operation occurs, during which the line 12 is at ground and the current of the cell P2 of the matrix 3 flows in the load transistor M2. In analogous mode the load transistor M1 carries the current coming from the reference cell P1.

Figure 2:
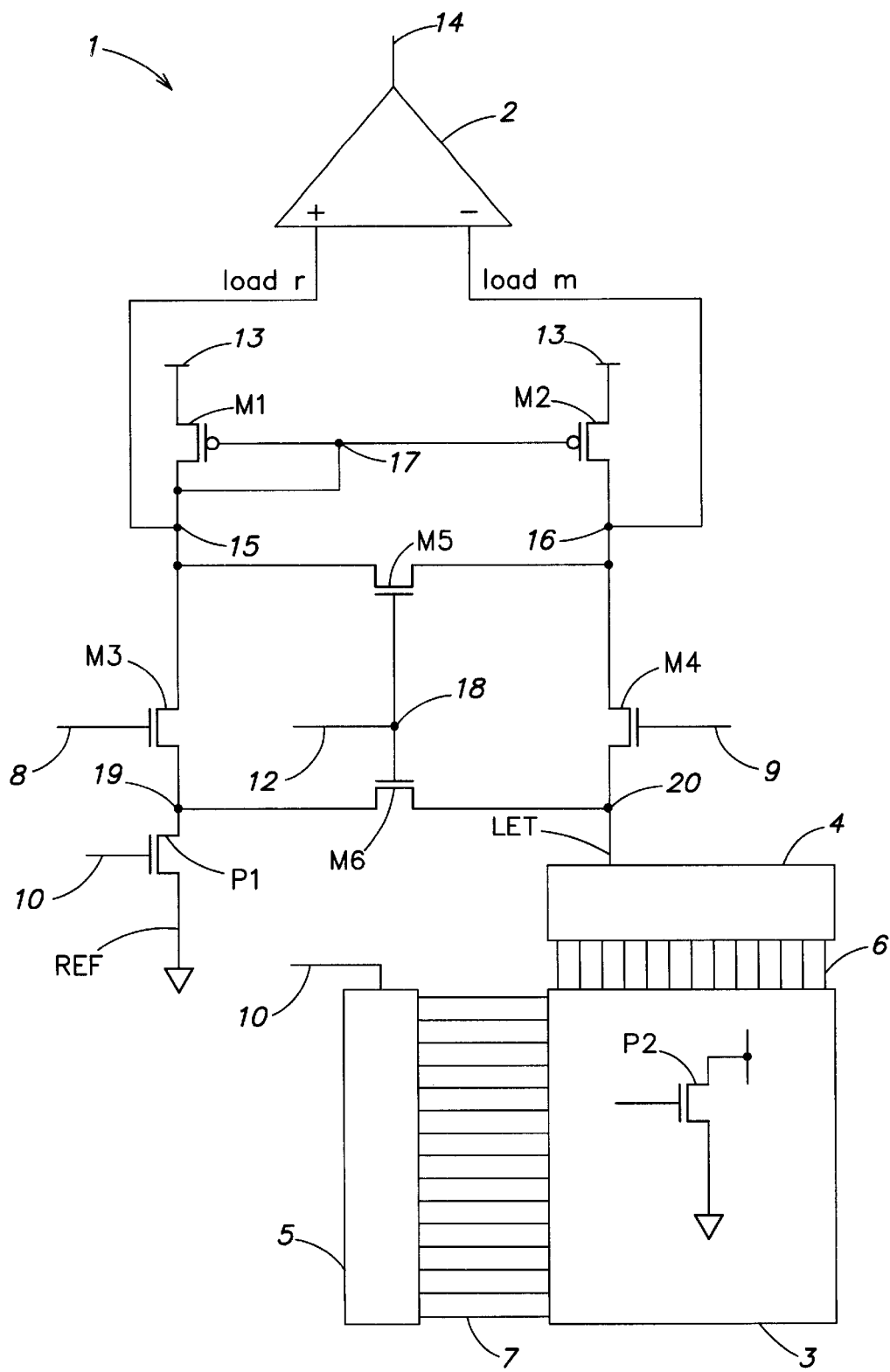
FIG. 2 illustrates a sense amplifier according to the prior art with fixed current unbalance.

In FIG. 2 there is illustrated a simplified schematic diagram of a sense amplifier according to the prior art with fixed current unbalance, including a reference branch "REF" and a reading branch "LET".

According to that illustrated in such a figure it is noted that the load transistor M1 has the gate electrode in common at the node 17 with the load gate of the transistor M2; the source electrode of the transistor M1 is linked with the supply line 13 as well as the transistor M2, that is the transistor M2 is now connected like a mirror configuration.

The operational amplifier 2 has the positive terminal, called "loadr", linked at the node 15 with the drain electrode of the transistor M1, with an electrode of the transistor M5 and with an electrode of the transistor M3, while the negative terminal, called "loadm", is linked at the node 16 with the drain electrode of the transistor M2, with the other electrode of the transistor M5 and with an electrode of the transistor M4.

When M2 is connected in a mirror configuration, that is said transistor becomes a current generator, the output resistance of M2 continues to be 1/g2 and it is obtained that the differential voltage at the nodes 15 and 16 depends on the currents of the cells P1 and P2 and on the transconductances of the load transistors M1 and M2. These voltages are compared with each other in the operational amplifier 2, the output 14 of which will be high if the current of the reference cell P1 divided for the transconductance of the load transistor M1 is lower than the current in the memory cell P2 divided for the transconductance of the load transistor M2, that is (Ir/g1)<(Ic/g2); it will be low if the current of the reference cell P1 divided for the transconductance of the load transistor M1 is higher than the current in the memory cell P2 divided for the transconductance of the load transistor M2, that is (Ir/g1)>(Ic/g2). Therefore the sensing ratio is equal to the transconductance ratio of the load transistors M1 and M2.

Figure 3:
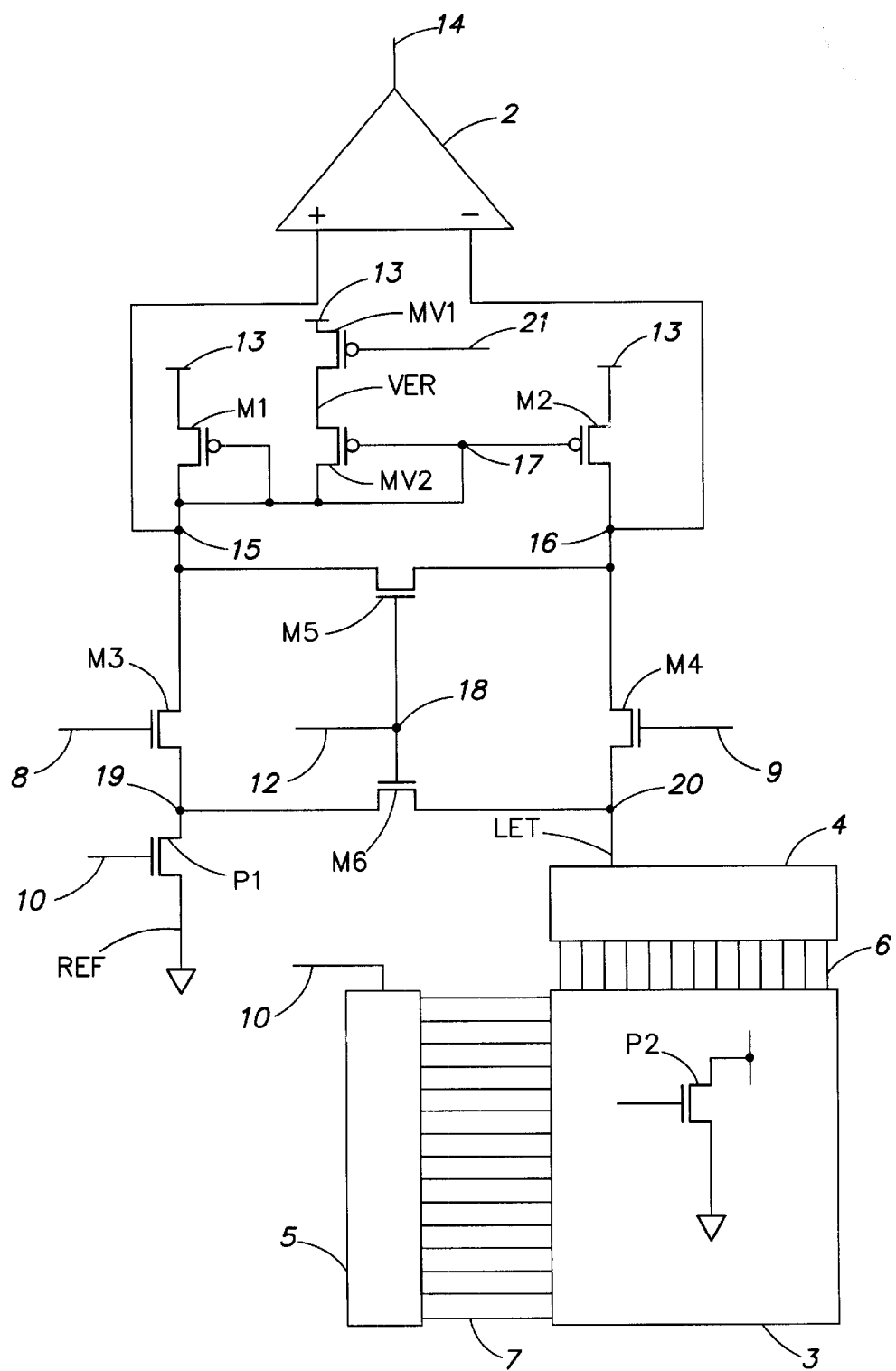
FIG. 3 shows a sense amplifier with fixed current unbalance according to the prior art with a branch for verification and programming operation of the memory cell.

In FIG. 3 there is shown a sense amplifier structure with fixed current unbalance according to the prior art with a verify branch, called VER, of the programming state of the cell. This branch is controlled by a horizontal line 21, called "verify", and two p type-transistors MV1 and MV2.

The MV1 transistor has the source electrode linked with the supply line 13 and the gate electrode with the line 21, and it has the drain electrode in common with the source electrode of the transistor MV2. The gate electrode of the transistor MV2 is in common with the gate electrode of the transistor M2 and the drain electrode in common with the gate of the transistor M1.

With the introduction of this verification branch, after the programming operation of the memory cell P2 has been performed, it is possible to modify the sensing ratio in a discrete way, by replacing one or both transistors M1 and M2, or adding one or more transistors M1 or M2 in parallel with that already present in the circuit schematic, according to outcoming logical signals.

Figure 4:
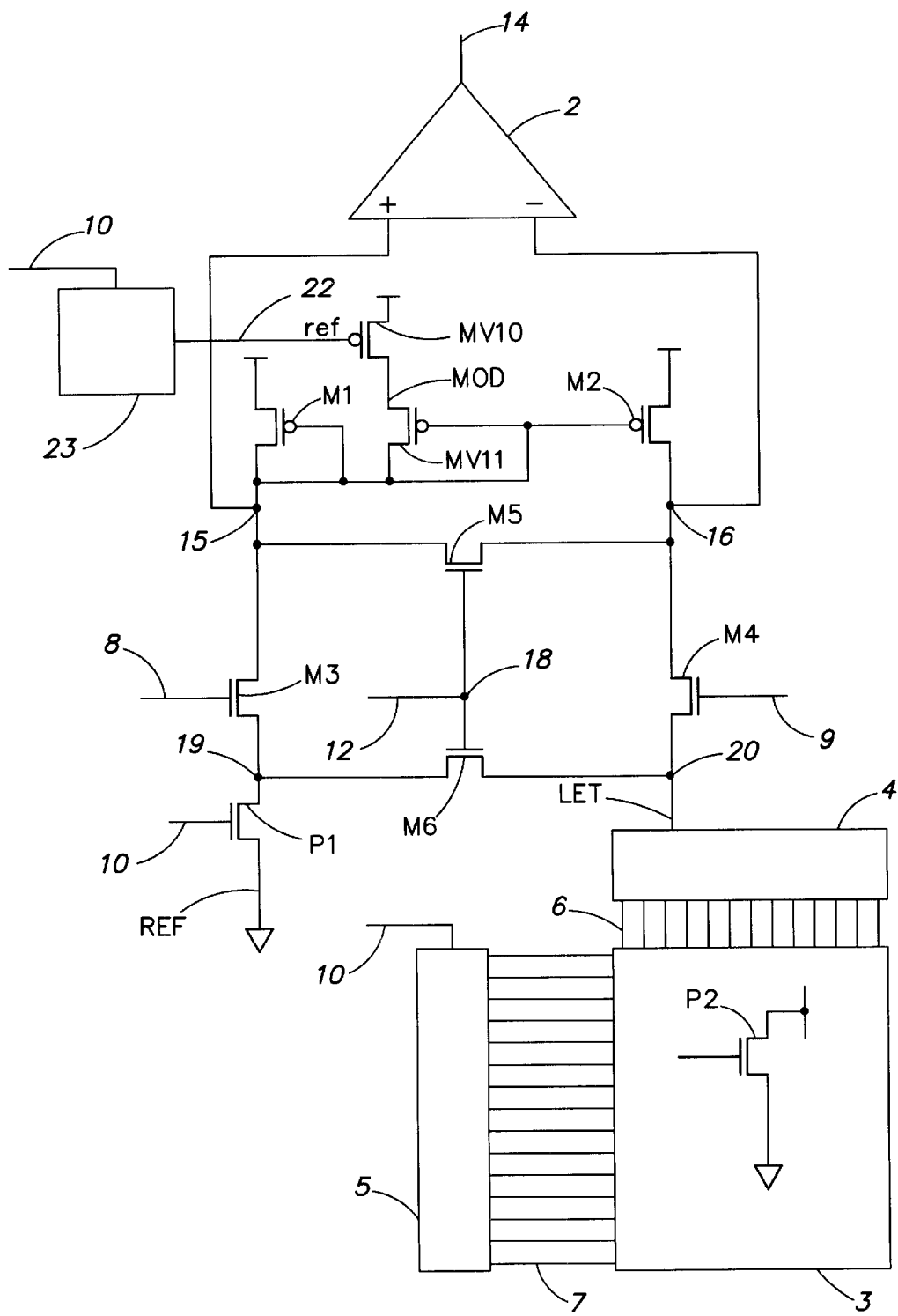
FIG. 4 shows a sense amplifier according to the invention with analogously modulated transconductance.

In FIG. 4 there is shown a schematic embodiment of a sense amplifier with analogously modulated transconductance according to the present invention.

As shown in such a figure there is a reference line 22, called "ref"; a load bias voltage generator 23; two p-type transistors MV10 and MV11, making a branch called MOD.

The generator 23, as later described in detail with reference to FIG. 5, has the function to bias through the line 22 the transistor MV10 according to the reading voltage of the memory cell P2. In this way the transconductance of one of the two load transistors M1 and M2 is analogously modulated as a function of the reading voltage on the line 10. For example, by increasing the voltage on the line 10, it is possible that the current of the cell P1 increases and the value of the total transconductance G1, given by the parallel of the transconductances of the transistors M1 and MV11 respectively, lessens. This causes the increase of the sensing ratio value k (with k=g2/G1) and having an increasing k it is possible to extend the reading voltage value by which the device works, in comparison with the case where k is fixed.

In this way it is possible that the sensing ratio k follows a trend according to the desired reading voltage of the memory cell P2, that is k=f (Vread).

Figure 5:
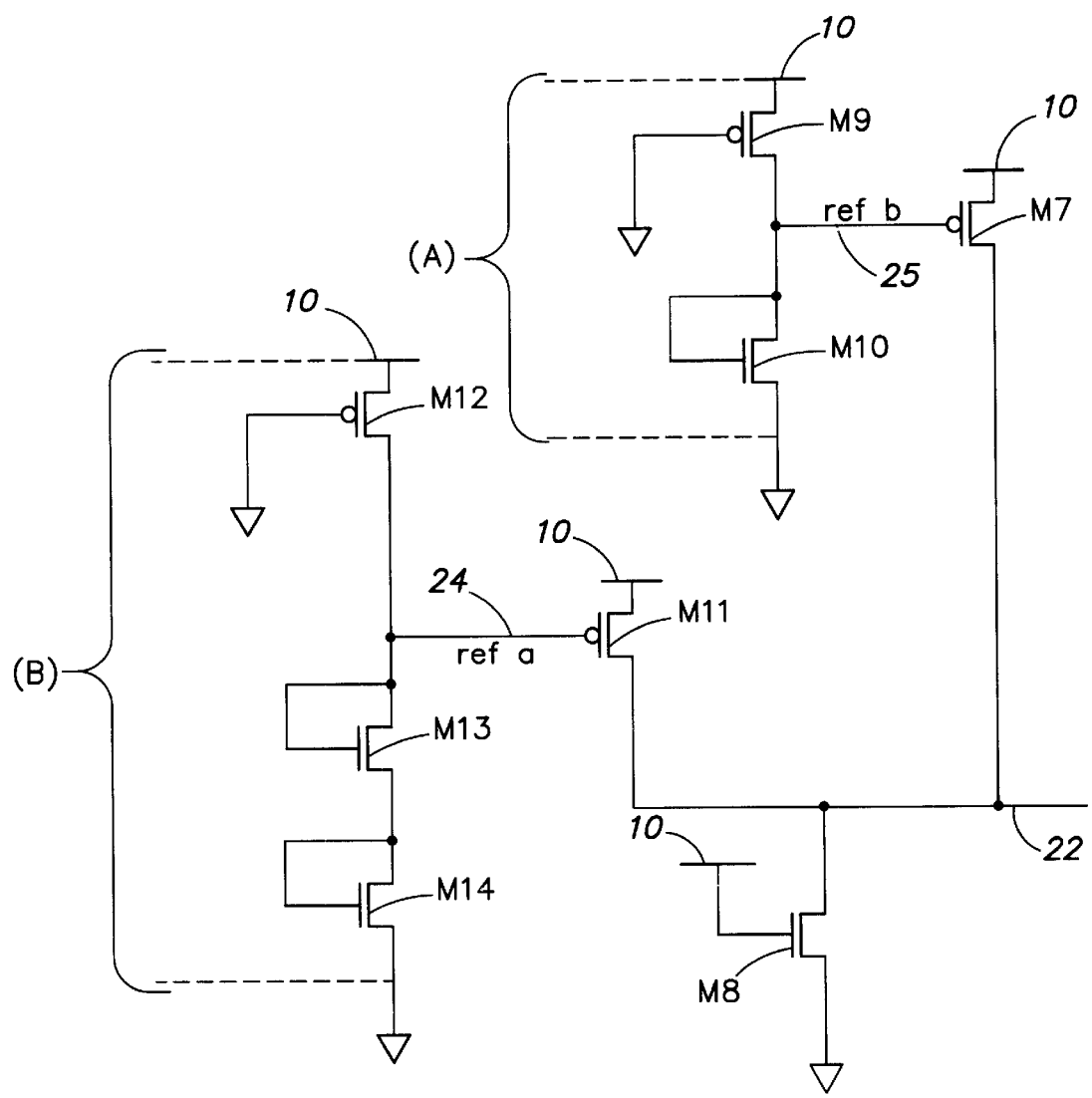
FIG. 5 illustrates an embodiment of the transconductance modulator associated with the sense amplifier of FIG. 4.

In FIG. 5 is shown an embodiment of the load voltage generator 23 or load transconductance modulator of the sense amplifier of FIG. 4.

As shown in such figure there are a plurality of p-type transistors M7, M9, M11, M12; a plurality of n-type transistors M8, M10, M13, M14; a first reference line 24, called "refa", and a second reference line 25, called "refb", distinct from each other.

The voltage on the line 22 is produced by a voltage divider made by the transistor M8 and the two transistors M7 and M11. The transistors M7 and M11 are modulated respectively by two voltage dividers M9, M10, indicated with A, and M12, M13, M14, indicated with B, respectively. The voltage dividers A and B are constituted by a p-type load transistor, M9 in the case of A and M12 in the case of B, and by one or two n-type transistors arranged by transdiode configuration, M10 in the case of A and M13, M14 in the case of B.

When the voltage on the line 10, that is the reading voltage of the memory cell P2, is less than the threshold value ("Vtn") of the n-type transistor M10 of the voltage divider A, and than the threshold value ("2Vtn") of the n-type transistors M13 and M14 of the voltage divider B, the voltages on lines 24 and 25 are equal to the voltage value present on the line 10. When, on the line 10, a larger voltage is present with respect of that of the previous case, the lines 24 and 25 of the respective voltage dividers will have, respectively, a voltage equal to $2*V_{tn}$ and a voltage equal to $2*V_{tn}$, increased by a delta factor that depends on the size of the n-type transistors M10, M13, and M14. This increase factor of the voltage present on the lines 24 and 25 increases with the voltage on the line 10 and it will increase with the increase of this voltage.

When on the line 10 a low voltage is present, the two p-type transistors M7 and M11 are off and therefore the voltage on the line 22, on account of the presence of the transistor M8, that is also in the off zone, is at ground level.

This is the condition for which the load of the sense amplifier, made by transistors M1, MV10 and MV11, has the maximum transconductance and the sensing ratio is small.

When the voltage on the line 10 increases, the first transistor which goes into conduction zone will be the transistor M7, because the condition for which said transistor goes into conduction zone is that for which the existing voltage difference between the gate and source electrodes, that is the voltage present on the line 10 less the voltage present on the line 25, is higher than the threshold voltage Vtp of the p-type transistor being examined, that is: Vgs= Vdd−Vrefb>Vtp. Besides Vrefb is equal to the threshold voltage of the n-type transistor M10 plus a delta factor, that is: Vrefb=Vtn+delta. It is inferred that the voltage Vgs that turns on the transistor M7 increases with the voltage present on the line 10, that it increases with the reading voltage of the cell P2. The voltage present on the line 22 will be the partition between the transistors M7 and M8.

Equally for the p-type transistor M11. In fact the turn-on condition of said transistor is verified when the voltage difference between the gate and source electrodes, that is the voltage present on the line 10 less the voltage present on the line 24 is higher than the threshold voltage of the p-type transistor in examination, that is Vgs=Vdd−Vrefa>Vtp. Besides Vrefa is equal to twice the threshold voltage 2Vtn of the n-type transistors M13 and M14 plus the delta factor, that is: Vrefa=2Vtn+delta. It is inferred therefore that the transistor M11 also will enter in the voltage divider with the transistor M8 at higher reading voltages of the cell, so that the voltage on the line 22 is higher and so the transconductance value G1 is smaller and therefore the sensing ratio value raises with the increase of the reading voltage of the cell P2.

For enough high voltages present on the line 10, we will have that the voltage present on the line 10 less the voltage present on the line 22 is less than the threshold value of the p-type transistor, that is the load modulated by this circuit will be off.

Figure 6:
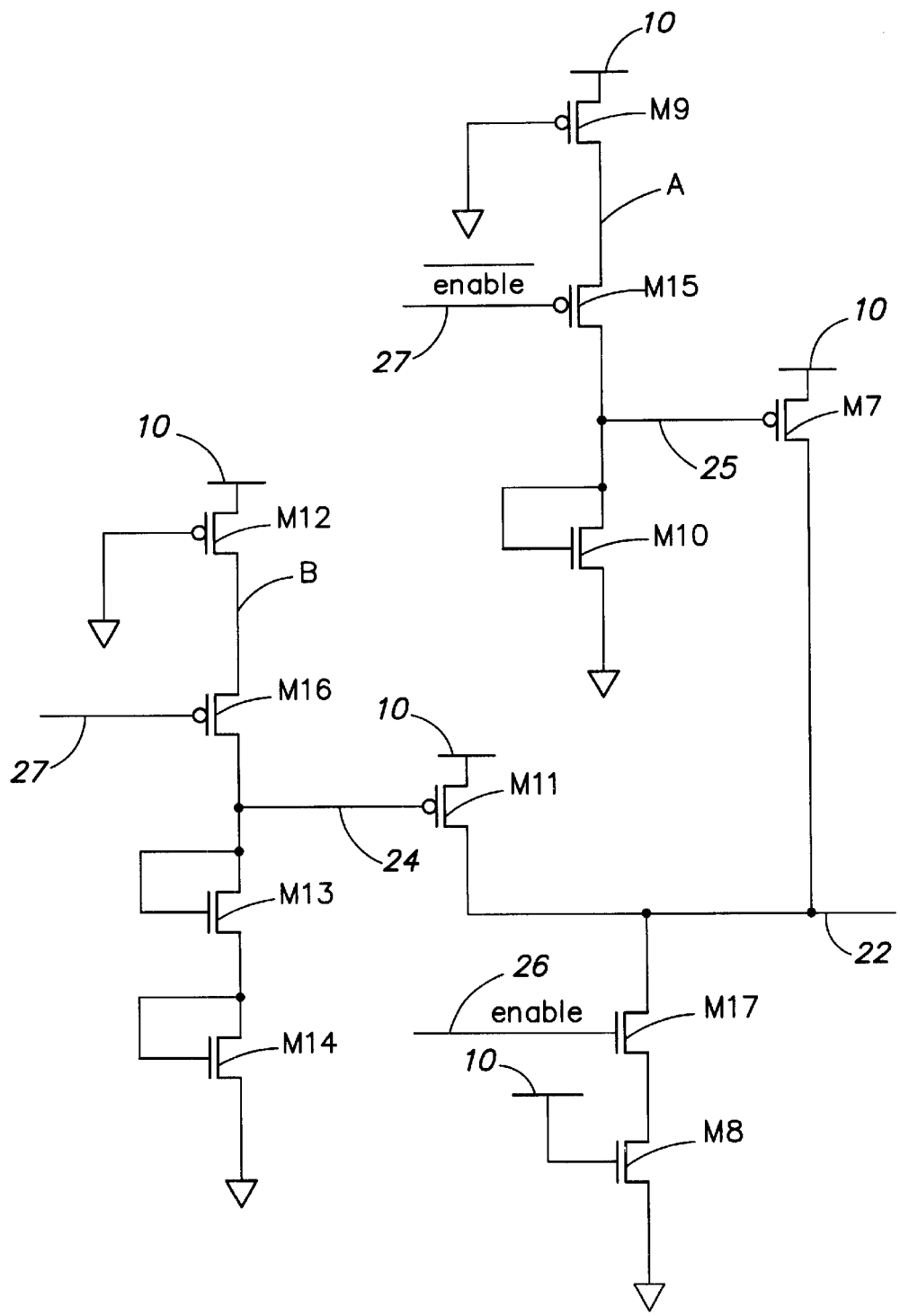
FIG. 6 shows a different embodiment of the transconductance modulator.

In FIG. 6 there is shown another embodiment of the transconductance modulator.

As shown in such figure there is a plurality of transistors M15, M16 and M17, where the first two are of p-type and the third of n-type; a first control line 26, called "enable"; a second control line 27, called "enable".

The transistors M15, M16 and M17 are added because in stand-by mode power is not dissipated and therefore there is an energy saving. This is made by lines 26 and 27, that according to the transported signal, turn off the voltage dividers; in particular, when the logic signal is high on line 27, the transistors M15 and M16 are in the off zone, while, when the logic signal is low on the line 26, the transistor M17 is turned off. With the circuit off the voltage on the line 22 becomes Vdd, that is the reading voltage of the cell P2.

Figure 7:
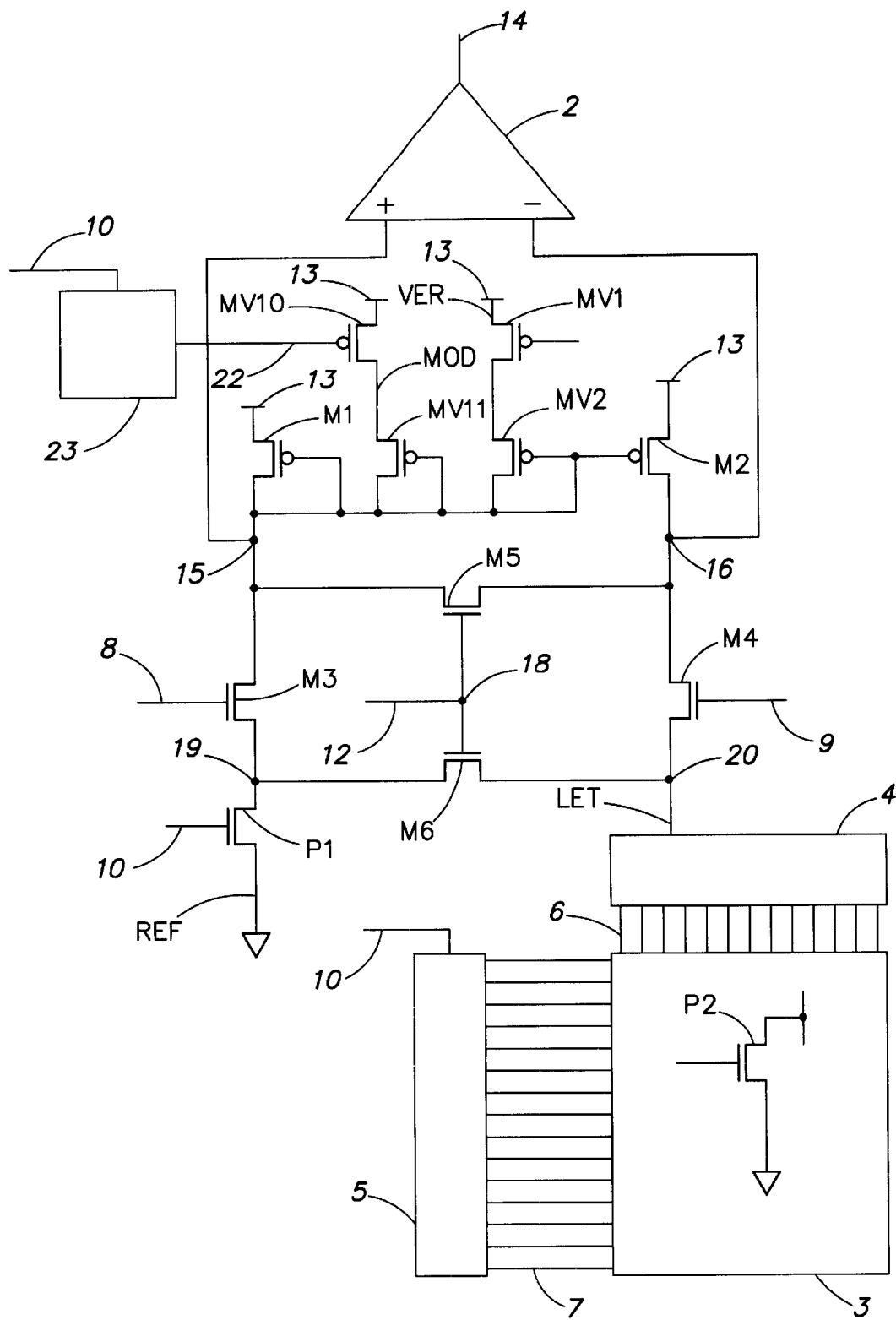
FIG. 7 illustrates a possible variant of the sense amplifier of FIG. 4.

In FIG. 7 there is shown a circuit scheme of a further sense amplifier of the present invention.

Such figure is an elaboration of FIG. 2 and FIG. 3, that is the branch for the verifying operation after the programming operation of the cell P2 and the modulation branch of the sense amplifier load are simultaneously present.

With this layout it is possible to pass from a sensing ratio k depending on the reading voltage to another dependence type, by replacing the modulated load with another having different technical-physical features, by means of a switch controlled by a specific logic signal, or adding to the load one or more loads in parallel (modulated or not), that is adding more branches formed by transistors of MV10 and MV11 type.

This layout type is useful in the case where those devices are used for which it is demanded, during a verify step after programming operation, a reduced reading operation of the voltage unbalance of the two branches of the sense amplifier, in order to guarantee a reliability margin to the programmed cell P2. In fact, for such a demand, it is sufficient to add a branch a formed by transistors of MV10 and MV11 type, activated by a verify logical signal after the programming operation, in parallel with the existing ones, so as to obtain during reading a loss of balance, that is a sensing ratio, depending on the reading voltage of the cell like k=f(V) and during verify operation after the programming operation a dependence on the loss-of-balance reading voltage like k'=g(V)<f(V).

Figure 8:
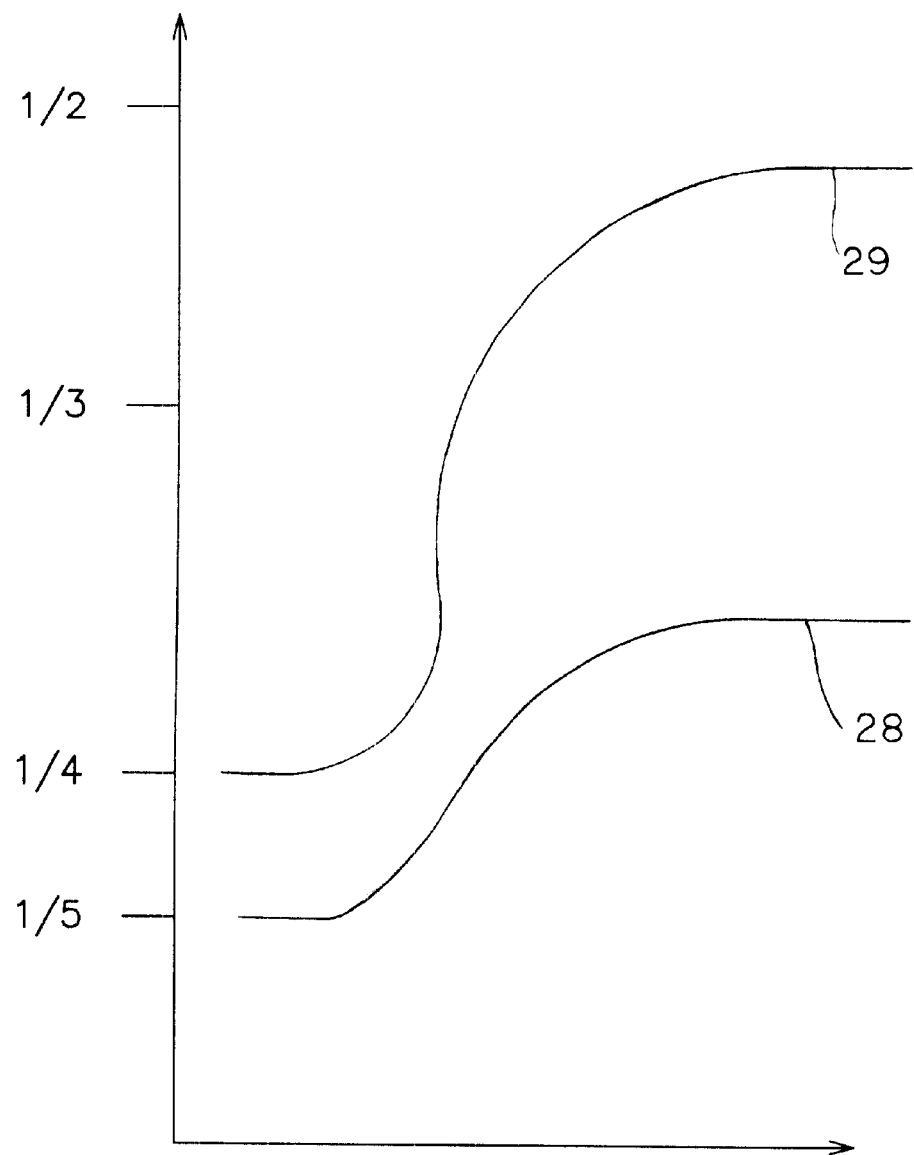
FIG. 8 shows the trend of the sensing ratio k in the sense amplifier according to the invention.

In FIG. 8 there is shown a trend of the sensing ratio k.

As shown in such figure there is an abscissae axis, representative of the voltage on the reading line 10, and an ordinate axis, representative of the sensing ratio k; two functions 28 and 29.

The line 29 shows a possible trend of the sensing ratio k in function of the voltage on the line 10, when the logic level of the line 21 is high; the line 28 shows a possible trend of the sensing ratio k in function of the voltage on the line 10 when the logic level on the line 21 is low. It is noted in this last case that the sensing ratio K is reduced in comparison with the case represented by line 29.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Method for reading non-volatile memory cells comprising a first step in which a memory cell of a matrix is selected by a row decoder and by a column multiplexer, a second step of preload and equalization during which a voltage on a drain electrode of the selected memory cell reaches a predefined value, and a third step during which the selected cell is read with a sensing ratio depending on a gate biasing voltage of said cell.

2. Method according the claim 1 wherein during said third step the sensing ratio is modulated by a load biasing generator that works in function of the reading voltage of the selected cell.

3. Sense amplifier for non-volatile memory cells, comprising at least one reference branch with at least one load transistor and a reading branch for reading a programmed memory cell and including at least one load transistor, including at least one modulation branch with at least one modulation transistor and a load biasing voltage generator associated with said modulation transistor in such a way to modulate analogously a transconductance of one of the two load transistors as a function of a gate biasing voltage of the memory cell.

4. Sense amplifier according a claim 3 wherein said load biasing voltage generator comprises two supply voltage transistors, linked to an unique control line of the modulation transistor, and in their turn controlled by a reading voltage of the memory cell so as to be turned on at different values by the gate biasing voltage of the memory cell.

5. Sense amplifier according to claim 3, comprising at least one parallel load, including transistors added to said one of two load transistors to change a dependence of the transconductance modulation on a reading voltage of the memory cell.

6. Sense amplifier for non-volatile memory cells, comprising at least one reference branch with at least one load transistor and a reading branch for reading a programmed memory cell and including at least one load transistor, including at least one modulation branch with at least one modulation transistor and a load biasing voltage generator associated with said modulation transistor in such a way to modulate analogously a transconductance of one of the two load transistors as a function of a reading voltage of the memory cell;

wherein said load biasing voltage generator comprises two supply voltage transistors, linked to an unique control line of the modulation transistor, and in their turn controlled by the reading voltage of the memory cell so as to be turned on at different values by a gate biasing voltage of the memory cell; and wherein the supply transistors are biased by two voltage dividers respectively.

7. Sense amplifier according the claim 6, wherein said voltage dividers comprise a load transistor and, respectively, a transistor in transdiode configuration and two transistors in transdiode configuration.

8. Sense amplifier according to claim 7, wherein said voltage dividers further comprise transistors, and these further transistors that can be turned off as a function of a level of a logic signal carried by their control electrode lines.

9. Sense amplifier for non-volatile memory cells, comprising at least one reference branch with at least one load transistor and a reading branch for reading a programmed memory cell and including at least one load transistor, including at least one modulation branch with at least one modulation transistor and a load biasing voltage generator associated with said modulation transistor in such a way to modulate analogously a transconductance of one of the two load transistors as a function of a gate biasing voltage of the memory cell; and further comprising a selector driven by a suitable logic signal to modify a dependence of the transconductance modulation on a reading voltage of the memory cell.

* * * * *